United States Patent [19]

Cummins

[11] Patent Number: 5,278,777
[45] Date of Patent: Jan. 11, 1994

[54] EFFICIENT CANCELLING OF AC LINE INTERFERENCE IN ELECTRONIC INSTRUMENTATION

[75] Inventor: Kenneth L. Cummins, Madison, Wis.

[73] Assignee: Nicolet Instrument Corporation, Madison, Wis.

[21] Appl. No.: 419,091

[22] Filed: Oct. 10, 1989

[51] Int. Cl.$^5$ .............. G06F 15/20; H04B 15/04
[52] U.S. Cl. ................................ 364/574; 364/572; 364/724.19
[58] Field of Search ............. 364/572, 574, 724.19, 364/724.01, 724.16, 724.17, 724.2

[56] References Cited

U.S. PATENT DOCUMENTS

| | | | |
|---|---|---|---|
| 3,889,108 | 6/1975 | Cantrell | 364/724.19 |
| 4,228,517 | 10/1980 | Constant | 364/724.17 X |
| 4,537,200 | 8/1985 | Widrow | 128/696 |
| 4,858,199 | 8/1989 | Griffith | 367/45 |
| 4,878,188 | 10/1989 | Ziegler, Jr. | 364/724.01 |

OTHER PUBLICATIONS

Hush, et al. "An Adaptive IIR Structure for Sinusoidal Enhancement, Frequency Estimation, and Detection," IEEE Transactions on Acoustics, Speech, and Signal Processing, vol. ASSP-34, No. 6, 1986, pp. 1380-1390.
Roy, et al. "ESPRIT—A Subspace Rotation Approach to Estimation of Parameters of Cisoids in Noise," IEEE Transactions on Acoustics, Speech, and Signal Processing, vol. ASSP-34, No. 5, 1986, pp. 1340-1342.
Nehorai, et al. "Adaptive Comb Filtering for Harmonic Signal Enhancement," IEEE Transactions on Acoustics, Speech and Signal Processing, vol. ASSP-34, No. 5, 1986, pp. 1124-1138.
Eleftheriou, et al. "Tracking Properties and Steady-State Performance of RLS Adaptive Filter Algorithms," IEEE Transactions on Acoustics, Speech and Signal Processing, vol. ASSP-34, No. 5, 1986, pp. 1097-1110.
Rao, et al. "Adaptive Notch Filtering for the Retrieval of Sinusoids in Noise," IEEE Transactions on Acoustics, Speech and Signal Processing, vol. ASSP-32, No. 4, 1984, pp. 791-802.
Friedlander, "System Identification Techniques for Adaptive Noise Cancelling," IEEE Transactions on Acoustics, Speech and Signal Processing, vol. ASSP-30, No. 5, 1982, pp. 699-709.
Friedlander, "System Identification Techniques for Adaptive Signal Processing," IEEE Transactions on Acoustics, Speech and Signal Processing, vol. ASSP-30, No. 2, 1982, pp. 240-246.
Chan, et al. "A Parameter Estimation Approach to EStimation of Frequencies of Sinusoids," IEEE Transactions on Acoustics, Speech and Signal Processing, vol. ASSP-29, No. 2, 1981, pp. 214-219.
Plotkin, "Using Linear Prediction to Design a Function Elimination Filter to Reject Sinusoidal Interference," IEEE Transactions on Acoustics, Speech and Signal Processing, vol. ASSP-27, No. 5, 1979, pp. 501-506.
Widrow, et al., "Adaptive Noise Cancelling; Principles and Applications," Proceedings of the IEEE, vol. 63, No. 12, 1975 pp. 1692-1716.

*Primary Examiner*—Edward R. Cosimano
*Attorney, Agent, or Firm*—Foley & Lardner

[57] ABSTRACT

Efficient cancellation of AC power line interference from a signal received by electronic instruments, such as biomedical monitors, is obtained by efficiently estimating the magnitude and phase of the noise signal from the contaminated input signal in a digital signal processor. Each interfering noise component of known frequency is represented as a sinusoid composed of cosine and sine components having estimated amplitude parameters. These amplitude parameters are recalculated at discrete points in time in the digital signal processor to carry out substantially a Fourier integration on the input signal at the known frequency $f_0$ of the interfering signal, with the integration being updated to the last sample. The integration can be carried out to allow the estimates to adapt to time varying amplitudes and/or phases of the interfering signals. Cancellation of the estimated noise sinusoid from the input signal results in an output signal substantially uncontaminated by the noise.

14 Claims, 2 Drawing Sheets

EFFICIENT CANCELLING OF AC LINE INTERFERENCE IN ELECTRONIC INSTRUMENTATION

FIELD OF THE INVENTION

This invention relates generally to the field of electronic instrumentation, particularly biomedical instrumentation, and to methods and systems for reducing the effect of noise in such systems.

BACKGROUND OF THE INVENTION

In various types of electronic instruments in which weak signals are highly amplified for further processing, electromagnetic interference from nearby power lines and equipment can often result in significantly contaminated signals. Such contamination frequently arises in the recording of neural signals from the surface of the human body (particularly signals from the brain and spinal cord), with the interference signal sometimes being as large or larger than the signal of interest. The interference typically contains the line fundamental frequency (60 Hz in the U.S. or 50 Hz in Europe) and the first few harmonics of the line frequency.

Many existing biomedical monitoring systems, such as electroencephalographic (EEG) monitoring systems, include optional "notch filters" which reduce this power line frequency interference by filtering out all energy at the fundamental frequency, and in some cases at the major harmonics. However, users of the instruments usually prefer to avoid using the notch filters because the filters introduce significant phase distortion near the notch frequencies and frequently cause the filtered signal to "ring" when a transient or impulse-like input is applied. A further disadvantage of the use of notch filters is that because they eliminate virtually all energy at and near the notch frequency, important signal components can be lost.

SUMMARY OF THE INVENTION

The present invention provides an efficient line interference canceller which eliminates the AC power line interference from the monitored signal while avoiding the signal degradation enountered with the use of notch filters. The cancellation technique presumes a priori knowledge of the frequency or frequencies of the (substantially sinusoidal) interference to some known degree of uncertainty. It is particularly adapted to the digital signal processing of sensor signals which are amplified and converted to digital data, with the noise cancelling being carried out by the digital signal processing circuitry utilizing software implementation in the signal processor.

Each of the interfering noise components may be represented as a sinusoid whose frequency is known (e.g., 60 Hz and harmonics for power line interference in the U.S.), with the magnitude and phase of the sinusoid being unknown. Estimates are made of the magnitude and phase of the noise sinusoid based on an examination of input signal data, and the resulting noise estimate is subtracted from the input signal. Accurate estimation of magnitude and phase results in substantially complete cancellation of the constant frequency noise components. The system of the present invention may be utilized to track changes in the amplitude and phase of the interfering sinusoids if the amplitude or phase varies with time.

In the preferred implementation of the invention, carried out in the digital signal processor for the system, the desired sampled signal s(k) is extracted from the input signal x(k) which contains the constant frequency noise component $n_f(k)$. The noise estimate $\hat{n}(k)$ is given by the following equation:

$$n_f(k) = a_j \cos[2\pi(f_0/f_s)k]$$

where $f_0$ is the frequency of the interference signal, $f_s$ is the sampling frequency, and the amplitude estimates $\hat{a}_j$ and $_j$ are recalculated at every time point j, using the recursion relations:

$$a(j) = \frac{(j-1)}{j} a(j-1) + \frac{2x}{j}(j)\cos(j)$$

$$b(j) = \frac{(j-1)}{j} b(j-1) + \frac{2x}{j}(j)\sin(j),$$

Where $\hat{a}_j(0) = (0) = 0$.

For many biomedical applications, such as EEG monitoring, where the signals of interest are primarily at relatively low frequencies, it is acceptable to sample the data at 240 Hz, providing a maximum signal bandwidth of 120 Hz. By sampling this multiple of the 60 Hz power line frequency, the harmonics of 60 Hz are aliased to either 0 Hz, 60 Hz, or 120 Hz. To obtain noise cancellation, only four parameters need to be calculated: one for the DC component, two for the 60 Hz component (sine and cosine), and one for the 120 Hz component the cosine component, because 120 Hz is the Nyquist frequency). Finally, all the values for the sine and cosine sequences for these components are either plus or minus one. These properties allow the cancellation of the 60 Hz noise component and all of its harmonics to proceed with minimal computational burden.

Further objects, features, and advantages of the invention will be apparent from the following detailed description when taken in conjunction with the accompanying drawings.

DETAILED DESCRIPTION OF THE INVENTION

Figure 1:
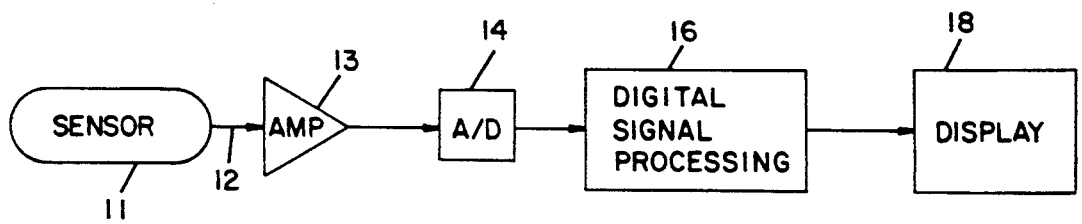
FIG. 1 is an illustrative block diagram of a generalized electronic monitoring instrument typical of biomedical monitoring equipment.

An exemplary type of instrumentation system in which the present invention may be utilized is shown in FIG. 1, in which a sensor 11 monitors some condition and provides a low level output signal on a line 12. Alternatively, the low level output signal may appear differentially (not shown) across two output lines 12 of the sensor 11. The sensor 11 may be a biomedical sensor, such as an EEG electrode positioned on the body of a patient. The very low level electrical signals on the line 12 are highly amplified by an amplifier 13 before the amplified signal is passed to various analyzing equipment; for purposes of illustration, the instrument is shown in FIG. 1 as comprising an analog to digital converter 14, a digital signal processing system 16, and a display system 18 which displays the processed and analyzed data from the digital signal processor 16. The processor 16 may comprise a programmed microcomputer system or various special purpose computer systems well known in the art.

The problem typically encountered in biomedical instrumentation, as well as in many other types of monitoring systems, is that the voltage levels of the signal from the sensor on the line 12 are so low, and the amplification required in the amplifier 13 is so great, that electromagnetic interference picked up by the sensor or on the connecting line 12 will get amplified by the amplifier and may badly corrupt or even overwhelm the signal from the sensor. A particularly significant electromagnetic interference is picked up through the human body from electric power lines near the sensors or from the power line connected to the instrument itself. The electromagnetic noise component coupled from the power lines will typically appear at the power line frequency, e.g., 60 Hz (50 Hz in Europe), and harmonics of the fundamental power line frequency, 120 Hz, 240 Hz (100 Hz and 200 Hz respectively in Europe), and so forth. The principal harmonics may be sufficiently large in magnitude to also significantly corrupt the desired signal obtained from the sensor.

In the present invention, digital signal processing in the processor 16 is carried out to remove the electromagnetic interference at one or more discrete frequencies. The noise cancellation process carried out by the digital signal processor is shown in schematic form in FIG. 2. The input signal x(k) provided at the input 20 is the sum of the desired sensor signal s(k) plus the noise component n(k) at the k'th sample. The input signal x(k) is provided on a forward path 21 to a summing junction 22. In addition, the signal x(k) is provided to estimators 24, 26, and others (not shown) for as many discrete noise frequencies as are to be cancelled. These frequencies are generally known a priori, to some degree of uncertainty. The output of each estimator is subtracted at the summing junction 22 from the input signal to provide an output signal y(k) on the output path 27 which is an estimator of the original signal of interest s(k).

Figure 2:
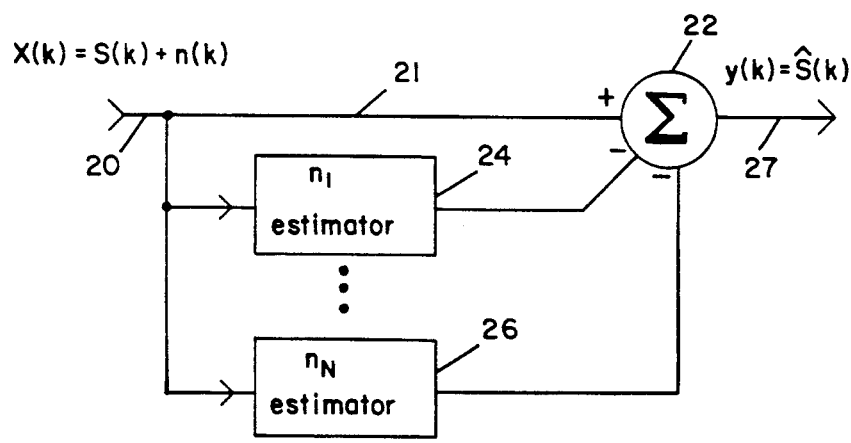
FIG. 2 is a diagram illustrating the noise estimation and the estimated noise component cancellation carried out in the digital signal processor.

The system illustrated in FIG. 2 may be described mathematically by assuming that the input signal x(k) is the sum of a desired signal s(k) and a sinusoid component $n_i(k)$ with known frequency and unknown (but fixed) amplitude and phase. Thus:

$$x(k) = s(k) + n_i(k);$$

$$n_i(k) = c_i \cos[2\pi(f_0/f_s)k + \phi]$$

or, equivalently, $$n_i(k) = a_i \cos[2\pi(f_0/f_s)k] + b_i \sin[2\pi(f_0/f_s)k],$$

where $f_0$ is the frequency of the interference signal and $f_s$ is the sampling frequency of the analog to digital converter. The "cancelling" signal $\hat{n}_i(k)$ is the sum of the cosine and sine components weighted by their respective amplitude estimates $\hat{a}_i$ and $\hat{b}_i$. These amplitude estimates are recalculated at each time point j, using the following recursion relations:

$$a_i(j) = \frac{(j-1)}{j} a_i(j-1) + \frac{2x}{j}(j)\cos(j)$$

$$b_i(j) = \frac{(j-1)}{j} b_i(j-1) + \frac{2x}{j}(j)\sin(j)$$

where $\hat{a}_i(0) = \hat{b}_i(0) = 0$.

In this form, the foregoing recursive estimates of $a_i$ and $b_i$ are the Fourier integrals over the time interval [0,j]. In implementing the digital signal processing which carries out these estimates, at each time point j the computational burden consists of two division operations, two multiplications, one left shift (multiply by 2), and one add for each parameter $\hat{a}_i$ and $\hat{b}_i$. For the sake of efficiency, the sine and cosine values may be stored in memory as a numerical sequence, with the index into the sequence repeating periodically over one or more sinusoidal cycles. For storage efficiency, it is possible to store as little as one quarter of a cycle when the interfering frequency is harmonically related to the sampling frequency, as is frequently done for fast Fourier transforms.

Figure 3:
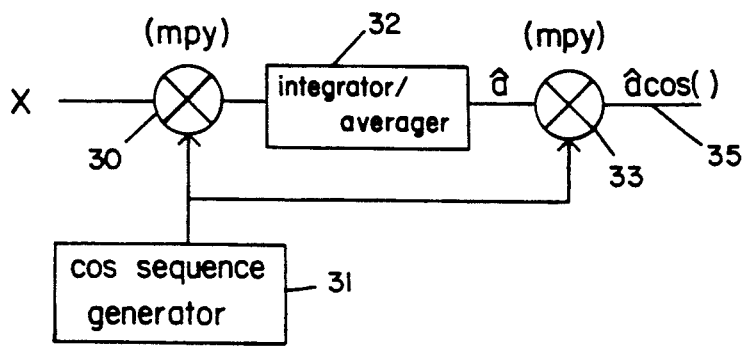
FIG. 3 is a block diagram illustrating the calculation of the cosine components of the estimated noise in the noise cancellation system carried out in the digital signal processor.

FIG. 3 is a block diagram showing the calculation of the cosine component of the noise estimate, it being understood that the calculation of the sine component would be carried out in an entirely analogous fashion. The input signal x is provided to a multiplier junction 30 which also receives the cosine numerical data from a cosine sequence generator 31. The output of the multiplier junction 30 is provided to an integrator/averager 32, the output of which is the estimator for the amplitude factor a for the particular one of the noise components being estimated. The cosine sequence generator also provides its output to a multiplier junction 33 which receives the estimator $\hat{a}_i$ to provide an output 35 equal to $\hat{a}_i \cos[2\pi(f_0/f_s)k]$. It may be noted that as j gets very large (e.g., greater than 1,000) the error in the estimators for $a_i$ and $b_i$ becomes quite small.

The final "noise-cancelled" output y(k) is calculated using the estimated a and b coefficients as follows:

$$y(k) = x(k) - a_i(j)\cos[2\pi(f_0/f_s)k] - b_i(j)\sin[2\pi(f_0/f_s)k]$$

Figure 4:
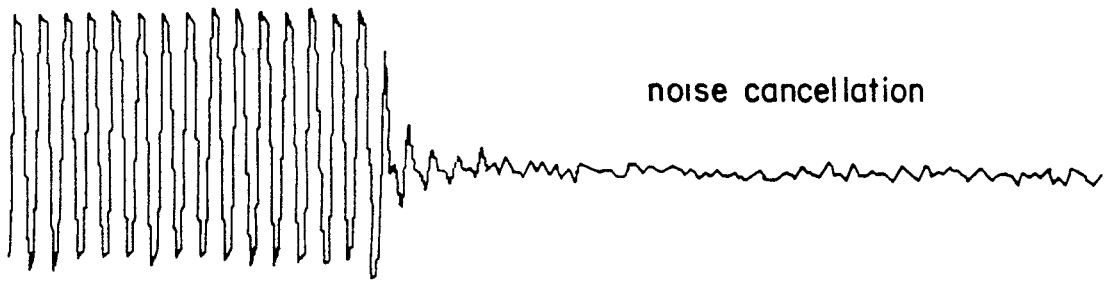
FIG. 4 is an illustrative plot of a signal containing a 60 Hz noise component before and after noise cancellation.

FIG. 4 is a plot of an exemplary output signal contaminated with 60 Hz interference before and after the foregoing filter was applied to the signal. The initial signal to (line) noise ratio was −25 dB. Within 300 milliseconds of the time the filter was implemented the signal to noise ratio reached +6.6 dB, a 35 dB improvement. The sampling frequency $f_s$ in this example was 240 Hz.

If the magnitude of the interfering noise signal which is to be cancelled varies over time or if there is an uncertainty in the frequency of the noise signal, the estimators of the coefficients a and b must be allowed to vary over time to accommodate these changing conditions. It may be noted that if the a priori frequency estimate is off by a small amount, the result is equivalent to the interfering signal having a time-varying amplitude over a period of time determined by the frequency error. Because the effect of a change in the magnitude of the interfering signal or a small uncertainty in its frequency is essentially the same, both of these conditions can be handled in the same way. For example, a "leaky integrator" can be implemented in the signal processor which maintains the same basic recursive structure as defined above, with even less computational burden. For this more general case, the recursion relation implemented in the digital processor for estimating the component coefficients are the following:

$$a_i(j) = \alpha a_i(j-1) + 2(1-\alpha)x(j)\cos(j)$$

$$b_i(j) = \alpha b_i(j-1) + 2(1-\alpha)x(j)\sin(j)$$

where $\alpha$ is a scalar between 0 and 1 and $\hat{a}_i(0) = \hat{b}_i(0) = 0$. When $\alpha$ is large, the parameters $\hat{a}_i$ and $\hat{b}_i$ are determined from long time integrals of the data, in a manner similar to the calculation of the coefficients $\hat{a}_i$ and $\hat{b}_i$ in the first implementation discussed above. When $\alpha$ is small, integration occurs over only a short interval, allowing the estimates of a and b to change rapidly. The faster the estimates are allowed to change, the greater will be the error in the estimates. Thus, there is a tradeoff for optimizing the value of $\alpha$ based on the amount of allowable error and the required accuracy of the estimation of the changing parameters a and b.

For most biomedical applications, such as EEG monitoring, it is acceptable to sample the sensor data at 240 Hz, thereby providing a maximum signal bandwidth of 120 Hz. Because there is an integer relationship between the sampling frequency and the 60 Hz noise frequency, several advantageous properties are obtained. First, all the harmonics of 60 Hz are aliased to either DC, 60 Hz, or 120 Hz. Second, only four parameters must be calculated, one for DC, two for 60 Hz (sine and cosine) and one for 120 Hz (cosine only, because 120 Hz is the Nyquist frequency). Finally, all the values for the sine/cosine sequences for these components are either plus or minus one, which is a result following from the fact that the frequencies involved are either DC, the Nyquist frequency, and the half-Nyquist frequency. These properties allow the noise cancellation of 60 Hz and all of its harmonics to proceed with a minimal computational burden. Of course, the same approach may be utilized for other noise components, such as the 50 Hz power line frequency in Europe, in which case the sampling rate would be 200 Hz rather than 240 Hz.

Although the examples given above illustrate the efficiencies that can be obtained for the noise canceler of the invention, it is possible to achieve modest computational savings by use of signal decimation during the calculation of noise parameters if the initial sampling frequency is a harmonic of the noise fundamental.

It is understood that the invention is not confined to the particular embodiments set forth herein as illustrative, but embraces all such modified forms thereof as come within the scope of the following claims.

What is claimed is:

1. In an electrical instrument having a source of a low level input signal which is amplified, converted to digital data and presented in a digital signal processor to provide an output signal, and wherein the input signal is contaminated by periodic noise components of substantially constant frequency, the improvement comprising:
   (a) means in the digital signal processor for estimating a noise component $n_i(k)$ at the sample k in the sampled input signal x(k) at the sample k in accordance with the expression:

$$n_i(k) = a_i \cos[2\pi(f_0/f_s)k] + b_i \sin[2\pi(f_0/f_s)k]$$

where $\hat{n}_i(k)$ is the estimator of the noise component $n_i(i)$, $f_0$ is the frequency of the interference noise component, $f_s$ is the sampling frequency at which the input signal is converted to digital data, and the coefficients $\hat{a}_i$ and $\hat{b}_i$ are recalculated for the sinusoidal component in the periodic noise at each time point j using the recursion relationships:

$$a_i(j) = \frac{(j-1)}{j} a_i(j-1) + \frac{2x}{j}(j)\cos(j)$$

$$b_i(j) = \frac{(j-1)}{j} b_i(j-1) + \frac{2x}{j}(j)\sin(j),$$

where $\hat{a}_i(0) = \hat{b}_i(0) = 0$; and
   (b) means in the digital signal processor for subtracting the noise estimator $\hat{n}_i(k)$ at the sample k from the input signal x(k) to yield an output signal from which the noise component has been substantially cancelled.

2. The electrical instrument of claim 1 wherein the sampling frequency $f_s$ is an integer multiple of the interference frequency $f_0$.

3. The electrical instrument of claim 2 wherein the frequency $f_0$ is 60 Hz and the sampling frequency $f_s$ is 240 Hz.

4. The electrical instrument of claim 2 wherein the frequency $f_0$ is 50 Hz and the sampling frequency $f_s$ is 200 Hz.

5. In an electrical instrument having a source of a low level input signal which is amplified, converted to digital data and processed in a digital signal processor to provide an output signal, and wherein the input signal is contaminated by periodic noise components of substantially constant frequency which may vary over time in amplitude, frequency, or phase, the improvement comprising:
   (a) means in the digital signal processor for estimating a noise component $n_i(k)$ at a sample k in the sampled input signal x(k) at the sample k in accordance with the expression:

$$n_i(k) = a_i \cos[2\pi(f_0/f_s)k] + b_i \sin[2\pi(f_0/f_s)k]$$

where $\hat{n}_i(k)$ is the estimator of the noise component $n_i(k)$, $f_0$ is the frequency of the interference noise signal and $f_s$ is the sampling frequency, and the amplitude estimates $\hat{a}_i$ and $\hat{b}_i$ are recalculated at each time point j using the following recursion relationships:

$$a_i(j) = \alpha a_i(j-1) + 2(1-\alpha) \times (j)\cos(j)$$

$$b_i(j) = \alpha b_i(j-1) + 2(1-\alpha) \times (j)\sin(j),$$

where $\alpha$ is a scalar between 0 and 1; and
   (b) means in the digital signal processor for subtracting the noise estimate $\hat{n}_i(k)$ at the sample k from the input signal x(k) to provide an output signal from which the noise component has been substantially cancelled.

6. The electrical instrument of claim 5 wherein the sample frequency $f_s$ is an integer multiple of the frequency $f_0$ of the noise interference signal.

7. The electrical instrument of claim 6 wherein the noise interference signal $f_0$ is 60 Hz and the sampling frequency $F_s$ is 240 Hz.

8. The electrical instrument of claim 6 wherein the noise interference signal $f_0$ is 50 Hz and the sampling frequency $F_s$ is 200 Hz.

9. A method of cancelling noise of substantially known discrete frequencies from an electrical input signal in an electronic instrument which includes a digital signal processor, comprising the steps of:
(a) receiving the input signal containing the desired signal of interest and at least one noise component whose frequency is substantially known but whose phase and magnitude is not known;
(b) sampling the input signal at a selected sample rate $f_s$ to provide digital data x(i) corresponding thereto, where k is the sample number;
(c) estimating the magnitude and phase of the noise component $n_i$ within the input signal data x(i) in accordance with the expression:

$$n_i(k) = a_i \cos[2\pi(f_0/f_s)k] + b_i \sin[2\pi(f_0/f_s)k]$$

where $\hat{n}(k)$ is the estimator of the noise component $n_i(i)$ and $f_0$ is a known noise frequency, and calculating the component estimators $\hat{a}_i$ and $\hat{b}_i$ as Fourier integrals of the cosine and sine components, respectively, over a time interval up to the time of the sample k; and
(d) subtracting the noise component estimate $\hat{n}(k)$ from the digital signal x(k) to provide an output signal from which the noise is substantially canceled.

10. The method of claim 9 wherein the amplitude estimators $\hat{a}_i$ and $\hat{b}_i$ are determined at each point in time j by the recursion relations:

$$a_i(j) = \frac{(j-1)}{j} a_i(j-1) + \frac{2x}{j}(j) \cos(j)$$

$$b_i(j) = \frac{(j-1)}{j} b_i(j-1) + \frac{2x}{j}(j) \sin(j),$$

where $\hat{a}_i(0) = \hat{b}_i(0) = 0$.

11. The method of claim 9 wherein the amplitude or phase of the noise signal component may change over time and wherein the amplitude component estimates $\hat{a}_i$ and $\hat{b}_i$ are determined at a point in time j by the recursion relations:

$$a_i(j) = \alpha a_i(j-1) + 2(1-\alpha) \times (j) \cos(j)$$

$$b_i(j) = \alpha b_i(j-1) + 2(1-\alpha) \times (j) \sin(j).$$

where $\alpha$ is a scalar between 0 and 1 and
where $\hat{a}_i(0) = \hat{b}_i(0) = 0$.

12. The method of claim 9 wherein the sampling frequency $f_s$ is an integer multiple of the frequency $f_0$ of the noise component.

13. The method of claim 12 wherein the frequency of the noise component $f_0$ is 60 Hz and the sampling frequency $f_s$ is 240 Hz.

14. The method of claim 12 wherein the frequency of the noise component $f_0$ is 50 Hz and the sampling frequency $f_s$ is 200 Hz.

* * * * *

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins (Page 1 of 6)

It is certified that error appears in the above-indentified patent and that said Letters Patent is hereby corrected as shown below:

1. In Column 2, line 5 of the patent, "$_i(k)$" should be --$\hat{n}_i(k)$-- as written in the application on page 3, line 13.

2. In Column 2, line 8 of the patent, "$n_i(k)=a_i\cos[2\tau(f_0/f_s)k]$" should be --$\hat{n}_i(k)=\hat{a}_i\cos[2\pi(f_0/f_s)k] + \hat{b}_i\sin[2\pi(f_0/f_s)k]$-- as written in the application on page 3, line 14.

3. In column 2, line 12 of the patent, "$_i$" should be --$\hat{b}_i$-- as written in the application on page 3, line 17.

4. In column 2, line 16 of the patent, both occurrences of "$a_i$" should be --$\hat{a}_i$-- as written in the application on page 3, line 19.

5. In column 2, line 18 of the patent, both occurrences of "$b_i$" should be --$\hat{b}_i$-- as written in the application on page 3, line 20.

6. In column 2, line 21 of the patent, "$\hat{a}_i(0)=_i(0)=0.$" should be --$\hat{a}_i(0)=\hat{b}_i(0)=0.$-- as written in the application on page 3, line 21.

7. In column 2, line 48 of the patent, "is a diagram" should be --is a block diagram-- as written in the application on page 4, line 16.

8. In column 3, line 58 of the patent, "$\tau$" should be --$\pi$-- as written in the application on page 6, line 19.

9. In column 3, line 62 of the patent, both occurrences of "$\tau$" should be --$\pi$-- as written in the application on page 6, line 20.

10. In column 3, line 66 of the patent, "$_i(k)$" should be --$\hat{n}_i(k)$-- as written in the application on page 6, line 23.

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins (Page 2 of 6)

It is certified that error appears in the above-indentified patent and that said Letters Patent is hereby corrected as shown below:

11. In column 3, line 68 of the patent, "$_i$." should be --$\hat{b}_i$.-- as written in the application on page 6, line 25.

12. In column 4, line 5 of the patent, both occurrences of "$a_i$" should be --$\hat{a}_i$-- as written in the application on page 6, line 28.

13. In column 4, line 7 of the patent, both occurrences of "$b_i$" should be --$\hat{b}_i$-- as written in the application on page 6, line 29.

14. In column 4, line 10 of the patent, "$\hat{a}_i(0)=_i(0)=0$." should be --$\hat{a}_i(0)=\hat{b}_i(0)=0$.-- as written in the application on page 6, line 30.

15. In column 4, line 16 of the patent, "$_i$" should be --$\hat{b}_i$-- as written in the application on page 7, line 4.

16. In column 4, line 39 of the patent, "$\tau$" should be --$\pi$-- as written in the application on page 7, line 26.

17. In column 4, line 45 of the patent, "$y(k)=x(k)-a_i(j)\cos[2\tau(f_0/f_s)k]-b_i(j)\sin[2\tau(f_0/f_s)k]$" should be --$y(k)=x(k)-\hat{a}_i(j)\cos[2\pi(f_0/f_s)k]-\hat{b}_i(j)\sin[2\pi(f_0/f_s)k]$-- as written in the application on page 7, line 32.

18. In column 5, line 7 of the patent, both occurrences of "$a_i$" should be --$\hat{a}_i$-- as written in the application on page 8, line 31.

19. In column 5, line 8 of the patent, both occurrences of "$b_i$" should be --$\hat{b}_i$-- as written in the application on page 8, line 32.

20. In column 5, line 10 of the patent, "$\hat{a}_i(0)=_i(0)=0$." should be --$\hat{a}_i(0)=\hat{b}_i(0)=0$.-- as written in the application on page 8, line 34.

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins (Page 3 of 6)

It is certified that error appears in the above-indentified patent and that said Letters Patent is hereby corrected as shown below:

21. In column 5, line 11 of the patent, "$_i$" should be --$\hat{b}_i$-- as written in the application on page 8, line 35.

22. In column 5, line 13 of the patent, "$_i$" should be --$\hat{b}_i$-- as written in the application on page 8, line 37.

23. In column 5, line 65 of the patent, "$n_i(k) = a_i \cos[2\tau(f_0/f_s)k] + b_i \sin[2\tau(f_0/f_s)k]$" should be --$\hat{n}_i(k) = \hat{a}_i \cos[2\pi(f_0/f_s)k] + \hat{b}_i \sin[2\pi(f_0/f_s)k]$-- as per Decision, Appendix A, line 11.

24. In column 5, line 67 of the patent, "$_i(k)$" should be --$\hat{n}_i(k)$-- as per Decision, Appendix A, line 12.

25. In column 5, line 68 of the patent, "$n_i(i),$" should be --$n_i(k),$-- as per Decision, Appendix A, line 13.

26. In column 6, line 3 of the patent, "$_i$" should be --$\hat{b}_i$-- as per Decision, Appendix A, line 16.

27. In column 6, line 8 of the patent,

" $a_i(j) = \frac{(j-1)}{j} a_i(j-1) + \frac{2x}{j}(j)\cos(j)$ "

should be

-- $\hat{a}_i(j) = \frac{(j-1)}{j} \hat{a}_i(j-1) + \frac{2x(j)}{j}\cos(j)$ -- as per Decision, Appendix A, line 19.

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins (Page 4 of 6)

It is certified that error appears in the above-indentified patent and that said Letters Patent is hereby corrected as shown below:

28. In column 6, line 10 of the patent,

" $b_i(j) = \frac{(j-1)}{j} b_i(j-1) + \frac{2x}{j}(j) \sin(j)$ "

should be

-- $\hat{b}_i(j) = \frac{(j-1)}{j} \hat{b}_i(j-1) + \frac{2x(j)}{j} \sin(j)$ -- as per Decision, Appendix A, line 20.

29. In column 6, line 13 of the patent, "$\hat{a}_i(0) =_i(0) = 0.$" should be --$\hat{a}_i(0) = \hat{b}_i(0) = 0.$-- as per Decision, Appendix A, line 21.

30. In column 6, line 15 of the patent, "$_i(k)$" should be --$\hat{n}_i(k)$-- as per Decision, Appendix A, line 23.

31. In column 6, line 41 of the patent, "$n_i(k) = a_i \cos[2\tau(f_0/f_s)k] + b_i \sin[2\tau(f_0/f_s)k]$" should be --$\hat{n}_i(k) = \hat{a}_i \cos[2\pi(f_0/f_s)k] + \hat{b}_i \sin[2\pi(f_0/f_s)k]$-- as per Amendment dated January 16, 1991.

32. In column 6, line 43 of the patent, "$_i(k)$" should be --$\hat{n}_i(k)$-- as per Amendment dated January 16, 1991.

33. In column 6, line 46 of the patent, "$_i$" should be --$\hat{b}_i$-- as per Amendment dated January 16, 1991.

34. In column 6, line 50 of the patent, both occurrences of "$a_i$" should be --$\hat{a}_i$-- as per Amendment dated January 16, 1991.

35. In column 6, line 52 of the patent, both occurrences of "$b_i$" should be --$\hat{b}_i$-- as per Amendment dated January 16, 1991.

36. In column 6, line 56 of the patent, "$_i(k)$" should be --$\hat{n}_i(k)$-- as per Amendment dated January 16, 1991.

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins (Page 5 of 6)

It is certified that error appears in the above-indentified patent and that said Letters Patent is hereby corrected as shown below:

37. In column 7, line 11 of the patent, "x(i)" should be --x(k)-- as per Amendment dated August 2, 1991.

38. In column 7, line 15 of the patent, "x(i)" should be --x(k)-- as per Amendment dated August 2, 1991.

39. In column 7, line 19 of the patent, "$n_i(k)=a_i\cos[2\tau(f_0/f_s)k] + b_i\sin[2\tau(f_0/f_s)k]$" should be --$\hat{n}_i(k)=\hat{a}_i\cos[2\pi(f_0/f_s)k] + \hat{b}_i\sin[2\pi(f_0/f_s)k]$-- as per Amendment dated August 2, 1991.

40. In column 7, line 21 of the patent, "$_i(k)$" should be --$\hat{n}_i(k)$-- as per Amendment dated August 2, 1991.

41. In column 7, line 22 of the patent, "$\hat{n}_i(i)$" should be --$\hat{n}_i(k)$-- as per Amendment dated August 2, 1991.

42. In column 7, line 24 of the patent, "$_i$" should be --$\hat{b}_i$-- as per Amendment dated August 2, 1991.

43. In column 7, line 28 of the patent, "$_i(k)$" should be --$\hat{n}_i(k)$-- as per Amendment dated August 2, 1991.

44. In column 8, line 2 of the patent, "$_i$" should be --$\hat{b}_i$-- as written in the application on page 13, line 29.

45. In column 8, line 5 of the patent, both occurrences of "$a_i$" should be --$\hat{a}_i$-- as written in the application on page 13, line 31.

46. In column 8, line 7 of the patent, both occurrences of "$b_i$" should be --$\hat{b}_i$-- as written in the application on page 13, line 32.

47. In column 8, line 10 of the patent, "$\hat{a}_i(0)=_i(0)=0.$" should be --$\hat{a}_i(0)=\hat{b}_i(0)=0.$-- as written in the application on page 13, line 33.

48. In column 8, line 14, "$_i$" should be --$\hat{b}_i$-- as written in the application on page 14, line 4.

UNITED STATES PATENT AND TRADEMARK OFFICE
CERTIFICATE OF CORRECTION

PATENT NO. : 5,278,777
DATED : January 11, 1994
INVENTOR(S) : Kenneth L. Cummins It is certified that error appears in the above-indentified patent and that said Letters Patent is hereby corrected as shown below:

49. In column 8, line 17 of the patent, both occurrences of "$a_i$" should be --$\hat{a}_i$-- as written in the application on page 14, line 6.

50. In column 8, line 17 of the patent, both occurrences of "$b_i$" should be --$\hat{b}_i$-- as written in the application on page 14, line 7.

51. In column 8, line 22 of the patent, "$\hat{a}_i(0)=_i(0)=0.$" should be --$\hat{a}_i(0)=\hat{b}_i(0)=0.$-- as written in the application on page 14, line 9.

Signed and Sealed this

Thirtieth Day of August, 1994

Attest:

BRUCE LEHMAN

*Attesting Officer*  *Commissioner of Patents and Trademarks*